United States Patent [19]

Iten

[11] 4,441,034
[45] Apr. 3, 1984

[54] CONTACT-CONTROLLED CAPACITIVE SWITCHING APPARATUS

[75] Inventor: Thomas Iten, Zug, Switzerland
[73] Assignee: Inventio AG, Hergiswil, Switzerland
[21] Appl. No.: 441,436
[22] Filed: Nov. 16, 1982
[30] Foreign Application Priority Data
Nov. 26, 1981 [CH] Switzerland ............... 7570/81
[51] Int. Cl.³ ............................. B66B 13/24
[52] U.S. Cl. ............................ 307/117; 340/593; 340/594; 187/29 R
[58] Field of Search ............... 307/116, 117; 340/593, 340/594; 187/29 R; 361/105, 106, 161, 162, 163, 165

[56] References Cited
U.S. PATENT DOCUMENTS
3,726,364  4/1973  Citrin et al. ............ 187/29 R
3,773,145 11/1973  Drexler ................... 187/29 R Primary Examiner—George H. Miller, Jr.
Assistant Examiner—Derek Jennings
Attorney, Agent, or Firm—Werner W. Kleeman

[57] ABSTRACT

A contact-controlled capacitive switching means utilized as a floor or cabin calling transmitter for lifts or the like is designed such that travel or drive commands for the lift are prevented from being generated by the action of heat or, if generated, from being further transmitted to a lift control system. Therefore, a thermal circuit breaker is interconnected between an actuating element, such as a contact button and a coupling member connected to an input of an oscillator. The thermal circuit breaker may be mounted directly at the contact button or at a mounting plate carrying the contact button. A further thermal circuit breaker is interconnected between an output of the switching means and a connection terminal of a signal transmitting line of the lift control system.

13 Claims, 1 Drawing Figure

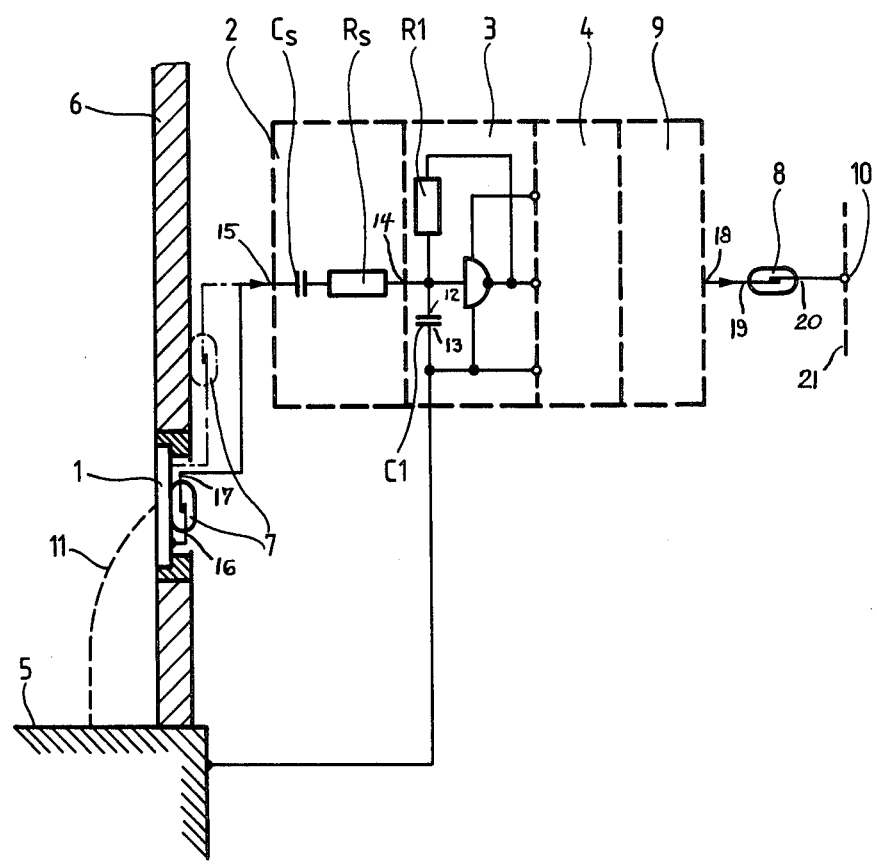

CONTACT-CONTROLLED CAPACITIVE SWITCHING APPARATUS

BACKGROUND OF THE INVENTION

The present invention relates to a new and improved contact-controlled capacitive switching means operating in a non-contact or contactless signalling mode. Such switching means are utilized, for example, in combination with floor or cabin calling transmitters in lift controls or lift control systems.

Generally speaking, the switching means or apparatus of the present development is of the type comprising an oscillator including a resistor-capacitor element determining the oscillator frequency. There is also provided a switching circuit connected after the oscillator, the input of which is connected to the oscillator and the output of which is adapted to be connected to a terminal of a signal transmitting line. The switching means also comprises a coupling member comprising at least one resistor and having a first and a second terminal, the first terminal being connected to the capacitor in the oscillator and the second terminal being adapted to be connected to an actuator element, such as a contact button. The capacitor in the oscillator is grounded. The oscillator frequency is changed if the contact button is activated and there is brought about a change of a discrete signal present at the output of the switching circuit.

A known switching means of this kind, for instance as disclosed in Austrian Pat. No. 362,446, comprises an oscillator including a Schmitt trigger and a frequency-determining resistor-capacitor element. The switching circuit which is series connected to the oscillator is formed by three series connected monostable multivibrators. The coupling member comprises a capacitor series connected with a resistor or just a resistor. The capacitor of the frequency-determining resistor-capacitor element has one connection to ground, so that the coupling member is connected in parallel to the capacitor of the frequency-determining resistor-capacitor element if the contact button is touched or otherwise actuated.

When utilizing such switching means in combination with a floor or cabin calling transmitter in elevators or lifts, reasons of safety require that, for instance, in case of fire faulty operation of the calling transmitter is prevented. This requirement cannot be satisfied by the switching means as described hereinbefore. In the case of fire breaking out on one particular floor, the air may become ionized due to the action of heat, so that an electrically conductive connection is established between the contact button and ground. A lift or elevator cabin servicing such a call may, then, become blocked at the burning storey or floor, for example by failure of the door control. The same effects also may result from damage or destruction to any one of the input or output-end components of the switching means due to thermal action.

SUMMARY OF THE INVENTION

Therefore, with the foregoing in mind it is a primary object of the present invention to provide a new and improved switching means which is not associated with the aforementioned limitations and drawbacks of the prior art designs.

Another and more specific object of the present invention aims at providing an economically advantageously fabricatable, yet still electrically high-grade switching means which does not exhibit the aforementioned drawbacks, and furthermore, is designed to be effectively utilized in particular, although not exclusively, in lift and lift control systems.

Still a further significant object of the present invention is directed to new and improved contact-controlled capacitive switching means which may be readily combined with presently available circuitry, in particular in such a way that accidental signals due to thermal action are prevented from becoming effective in an elevator lift control.

Now in order to implement these and still further objects of the invention, which will become more readily apparent as the description proceeds, the switching means or apparatus of the present development is manifested by the features that, basically a thermal circuit breaker is interconnected between the contact button and the coupling member, said thermal circuit breaker being placed either at the contact button or at a mounting plate carrying the same. A further thermal circuit breaker is interconnected between the output of an amplifier connected after the switching circuit and a terminal of a signal transmitting line of a lift control system.

In a more specific aspect of the invention the thermal circuit breaker has an input and an output, the input being adapted to be connected to the contact button and the output being connected to one of the terminals of the coupling member. A first terminal of the coupling member is connected to the capacitor of the oscillator and a second terminal thereof is adapted to be connected to the contact button or the like.

It is of advantage in the invention, that lift-operating commands initiated by thermal action and which would cause the lift or elevator to move to burning floors, no longer can occur, which may have a life-saving effect for persons occupying the lift cabin. The arrangement of the thermal circuit breaker constitutes a further advantage since the first thermal circuit breaker disposed at the input end of the switching means will prevent the occurrence of spurious switching operations due to ionization, and the second thermal circuit breaker disposed at the output-end will prevent the transmission of spurious switching commands due to eventual failures in the electronic components.

BRIEF DESCRIPTION OF THE DRAWINGS

The invention will be better understood and objects other than those set forth above, will become apparent when consideration is given to the following detailed description thereof. Such description makes reference to the annexed drawing wherein the single FIGURE shows a schematic block circuit diagram of the switching means or apparatus according to the invention.

DETAILED DESCRIPTION OF THE PREFERRED EMBODIMENTS

With reference to the drawing a floor calling transmitter for a lift forming a known capacitive switching means or apparatus as disclosed in the aforementioned Austrian Pat. No. 362,446 is shown in schematic block diagram and will be seen to include a contact button 1 or equivalent structure, a coupling member 2, an oscillator 3 and a switching circuit 4. The oscillator 3 includes a resistor-capacitor element which determines the oscillator frequency; the resistor is designated R1 and the capacitor is designated C1. The capacitor C1 has two terminals or connections 12 and 13. The control button 1 of the floor or storey calling transmitter is mounted, for instance, at a mounting plate 6 located on a related floor or storey 5. The coupling member 2 comprises a capacitor $C_s$ and a resistor $R_s$ and has a first terminal 14 and a second terminal 15. The first terminal 14 of the coupling member 2 is connected to the terminal or connection 12 of the capacitor C1. A first thermal circuit breaker 7 having an input 16 and an output 17 is shown by solid lines as being placed immediately at the contact button 1, or else may be mounted at the mounting plate 6 as shown in phantom lines. The input 16 of the first thermal circuit breaker 7 is connected to the contact button 1 and the output 17 of the first thermal circuit breaker 7 is connected to the second terminal 15 of the coupling member 2. The first thermal circuit breaker 7 may be any suitable commercially available type and is designed to interrupt the electrical connection between the contact button 1 and the coupling member 2 when a predetermined ambient temperature, in this case for instance 95° C., is exceeded.

In the illustrated block circuit diagram the switching circuit 4 is shown series connected with an amplifier 9 having an output 18 which is connected to the input 19 of a second thermal circuit breaker 8 of the same type as the first thermal circuit breaker 7, the output 20 of which is connected to the terminal 10 of a suitable signal transmitting line 21 of the lift control.

During normal operation a person standing on floor or storey 5 of the building and touching contact button 1 will produce a connection 11 to ground. Consequently, the coupling member 2 and the capacitor C1 in the oscillator 3 will be connected in parallel. Thus, the oscillator frequency will change as well as the signal at the output 18 of amplifier 9. In the event of an intensified thermal action, such as occurring during a fire, the connection 11 grounds the contact button 1 on the floor 5 due to air ionization. Also, spurious signals or switching operations may occur in the case of damage to or destruction of the electric components at the input side or at the output side of the floor calling transmitter. The trigger or activation temperature of the thermal circuit breakers 7 and 8 is advantageously selected such that the electrical connections at the input and output sides of the floor calling transmitter are properly interrupted in time, to thereby ensure that no spurious commands can develop or can be transmitted.

While there are shown and described present preferred embodiments of the invention, it is to be distinctly understood that the invention is not limited thereto, but may be otherwise variously embodied and practiced within the scope of the following claims.

Accordingly, what I claim is:

1. A contact-controlled capacitive switching means operating in a non-contact signalling mode and having a contact button, said switching means being located at a storey of a structure and comprising:
   an oscillator including a resistor-capacitor element determining the frequency of the oscillator;
   said capacitor having two terminals;
   a switching circuit series connected to said oscillator;
   a coupling member comprising at least one resistor and having a first terminal and a second terminal;
   one of said two terminals of said capacitor of said oscillator being connected to the first terminal of said coupling member and the other of said two terminals of said capacitor of said oscillator being grounded, so that upon actuating the contact button there is caused a change in the oscillator frequency and a change of a discrete signal present at an output of the switching means;
   a thermal circuit breaker having an input and an output; and
   said input being adapted to be connected to said contact button and said output being connected to said second terminal of said coupling member.

2. The contact-controlled capacitive switching means as defined in claim 1, further including:
   a mounting plate for supporting said contact button; and
   said thermal circuit breaker is mounted at said mounting plate.

3. The contact-controlled capacitive switching means as defined in claim 1, wherein:
   said thermal circuit breaker is mounted at said contact button.

4. The contact-controlled capacitive switching means as defined in claim 1, wherein:
   a signal transmitting line is provided for connection to an elevator control;
   an amplifier series connected to said switching circuit;
   said amplifier having an output; and
   a further thermal circuit breaker having an input connected to said amplifier output and having an output adapted to be connected to the signal transmitting line.

5. The contact-controlled capacitive switching means as defined in claim 4, wherein:
   said further thermal circuit breaker, when activated, preventing signal transmission from said amplifier to said elevator control.

6. A contact-controlled capacitive switching means operating in a non-contact signalling mode, said switching means being located at the storey of a structure and comprising:
   an oscillator including a resistor-capacitor element determining the frequency of the oscillator;
   said capacitor having at least two terminals;
   a coupling member comprising at least one resistor and having a first terminal and a second terminal;
   said first terminal of said coupling member being connected to one of said two terminals of said capacitor of said oscillator;
   a first thermal circuit breaker having an input and an output;
   said input being adapted to be connected to a contact button and said output being connected to said second terminal of said coupling member;
   a switching circuit series connected to said oscillator;
   an amplifier series connected to said switching circuit;
   said amplifier having an output; and
   a second thermal circuit breaker having an input connected to said amplifier output and having an output adapted to be connected to a signal transmitting line provided for connection to an elevator control.

7. The contact-controlled capacitive switching means as defined in claim 6, further including:
   a mounting plate for the contact button; and
   said first thermal circuit breaker being mounted at said mounting plate.

8. The contact-controlled capacitive switching means as defined in claim 6, wherein:

said first thermal circuit breaker is mounted at the contact button.

9. The contact-controlled capacitive switching means as defined in claim 6, wherein:
said second thermal circuit breaker, when activated, preventing signal transmission from said amplifier to said elevator control.

10. A lift control including capacitive switching means operating in a contactless signalling mode and being adapted to be connected to a signal transmitting line provided for connection to an elevator control, said switching meand being located at a storey of a structure and comprising:
an oscillator including a resistor-capacitor element determining the frequency of the oscillator;
said capacitor having at least two terminals;
a coupling member comprising at least one resistor and having a first terminal and a second terminal;
said first terminal of said coupling member being connected to one of said at least two terminals of said capacitor of said oscillator;
a first thermal circuit breaker having an input and an output;
an actuator element;
said input being connected to said actuator element and said output being connected to said second terminal of said coupling member;
a switching circuit series connected to said oscillator;
an amplifier series connected to said switching circuit;
said amplifier having an output;
a signal transmitting line; and
a second thermal circuit breaker having an input connected to said amplifier output and an output connected to the signal transmitting line.

11. The lift control as defined in claim 10, further including:
a mounting plate for monitoring said contact button; and
said first thermal circuit breaker being mounted at said mounting plate.

12. The lift control as defined in claim 10, wherein:
said first thermal circuit breaker is mounted upon said contact button.

13. The lift control as defined in claim 10, wherein:
said second thermal circuit breaker, when activated, preventing signal transmission from said amplifier to said elevator control.

* * * * *